United States Patent [19]
Hara

[11] Patent Number: 6,158,298
[45] Date of Patent: *Dec. 12, 2000

[54] STAGE APPARATUS AND EXPOSURE APPARATUS PROVIDED WITH THE STAGE APPARATUS

[75] Inventor: Hideaki Hara, Tokyo, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/166,192

[22] Filed: Oct. 5, 1998

Related U.S. Application Data

[63] Continuation of application No. 08/992,516, Dec. 17, 1997, abandoned, which is a continuation of application No. 08/623,008, Mar. 28, 1996, Pat. No. 5,839,324.

[30] Foreign Application Priority Data

Jun. 15, 1995 [JP] Japan .................................... 7-172855

[51] Int. Cl.$^7$ ...................................................... G12B 5/00
[52] U.S. Cl. ................... 74/490.09; 74/471 XY; 384/9; 384/12
[58] Field of Search .................. 74/490.09, 471 XY; 384/9, 12

[56] References Cited

U.S. PATENT DOCUMENTS

| | | |
|---|---|---|
| 3,969,004 | 7/1976 | Schliemann . |
| 4,118,042 | 10/1978 | Booth . |
| 4,409,860 | 10/1983 | Moriyama et al. . |
| 4,648,724 | 3/1987 | Sugiyama et al. . |
| 4,719,705 | 1/1988 | Laganza et al. . |
| 4,737,823 | 4/1988 | Bouwer et al. . |
| 4,766,465 | 8/1988 | Takahashi ................................. 355/53 |
| 5,040,431 | 8/1991 | Sakino et al. . |
| 5,098,204 | 3/1992 | Blanz . |
| 5,160,883 | 11/1992 | Blanz . |
| 5,228,358 | 7/1993 | Sakino et al. . |
| 5,726,548 | 3/1998 | Chiba et al. .............................. 384/12 |
| 5,773,953 | 6/1998 | Ukaji et al. ........................ 74/471 XY |

FOREIGN PATENT DOCUMENTS

| | | |
|---|---|---|
| 1-188241 | 7/1989 | Japan . |
| 4-223830 | 8/1992 | Japan . |
| 5-23890 | 4/1993 | Japan . |
| 7-115053 | 5/1995 | Japan . |

*Primary Examiner*—David Fenstermacher
*Attorney, Agent, or Firm*—Oliff & Berridge, PLC

[57] ABSTRACT

A stage apparatus comprises a pedestal, an X axis guide bar which is fixed on the pedestal, an X stage which is movable along an upper surface of the pedestal and the guide bar, and a Y stage which is placed over the X state and movable along the pedestal in a direction of the Y axis. Vacuum-preloadable static pressure air bearings, in which pressures of vacuum ports are independently controllable, are provided on a surface of the X stage opposing to the pedestal and on another surface of the X stage opposing to the X axis guide bar. By using the stage apparatus, the electric power consumption of driving means for movable units can be reduced, the amount of heat generation can be reduced, and the bearing gap can be adjusted highly accurately after assembling.

72 Claims, 5 Drawing Sheets

STAGE APPARATUS AND EXPOSURE APPARATUS PROVIDED WITH THE STAGE APPARATUS

This is a Continuation of Application Ser. No. 08/992,516, filed Dec. 17, 1997, abandoned, which in turn is a continuation of Application Ser. No. 08/623,008 filed Mar. 28, 1996, now U.S. Pat. No. 5,839,324.

BACKGROUND OF THE INVENTION

1. Field of the Invention

The present invention relates to a stage apparatus. In particular, the present invention relates to a stage apparatus which is preferably used, for example, as an X-Y stage apparatus included in an exposure apparatus or the like.

2. Description of the Related Art

An exposure apparatus, which transfers a pattern on a reticle with light for exposure onto a substrate to be exposed (photsensitive substrate, hereinafter referred to as "substrate"), includes a means for moving the substrate to a predetermined exposure position. An X-Y stage apparatus, which is provided with a substrate stage capable of movement in X and Y directions, is used as such a means for moving the substrate. Those which are used as such an X-Y stage apparatus include, for example, stage apparatuses of a type which make guidance by using static pressure air in order to realize movement and positioning of a stage at a high speed with high accuracy as disclosed in Japanese Patent Laid-Open Nos. 1-188241 and 4-223830.

FIG. 5 shows an example of a conventional X-Y stage apparatus of this type. In FIG. 5, a pedestal 100 is made of iron, to which an X guide 102 made of iron as a guide means in the X direction, and stators 104A, 106A of linear motors 104, 106 as driving means in the X direction are fixed. Movable elements 104B, 106B of the linear motors 104, 106 are connected to first and second Y guide carriers 110, 113 respectively. The spacing between the Y guide carriers 110, 113 is bridged with a Y guide 108 which serves as a guide means in the Y direction. Namely, the Y guide carriers 110, 113 and the Y guide 108 constitute a movable unit in the X direction. The movable unit is driven in the X direction in accordance with movement of the movable elements 104B, 106B in the X direction.

The first Y guide carrier 110 is provided with air-ejecting ports and permanent magnets (not shown) on its surface opposing to the pedestal 100 and on its another surface opposing to the X guide 102. The second Y guide carrier 113 is also provided with air-ejecting ports and permanent magnets (not shown) on its surface opposing to the pedestal 100. The first Y guide carrier 110 and the second Y guide carrier 113 float over the pedestal 100 and the X guide 102 while maintaining gaps of predetermined distances therebetween in such a manner that the pneumatic pressure as a repulsive force is balanced with the magnetic force as an attractive force.

A Y movable unit 111, which is movable in the Y direction along the Y guide 108, is attached to the Y guide 108 in such a manner that the Y guide 108 is surrounded by the Y movable unit 111 on its upper and lower, and right and left sides. A pair of X direction bearings 112 (one counterpart is not shown) are fixed to both side walls of the Y movable unit 111 so that the X direction bearings 112 interpose the Y guide 108 on both sides in the X direction. Air-ejecting ports are provided on the pair of X direction bearings 112 respectively. Accordingly, pressures of air spouted from the pair of X direction bearings 112 toward the Y guide 108 make a balance which allows a constant gap to be set between the X direction bearings 112 and the Y guide 108.

Air-ejecting ports and permanent magnets (not shown) are provided on a surface of the Y movable unit 111 opposing to the pedestal 100. The Y movable unit 111 floats over the pedestal 100 while maintaining a gap of a predetermined distance in such a manner that the pneumatic force is balanced with the magnetic force.

A stator 114A of a linear motor is fixed on an upper surface of the Y guide 108. A movable element (not shown) of the linear motor is attached to the Y movable unit 111. Thus the Y movable unit 111 is driven in the Y direction integrally with the movable element.

A top plate of the Y movable unit 111 serves as a substrate stage 114. Movement mirrors (not shown) for reflecting light from laser interferometers as coordinate-measuring means are carried on the substrate stage 114. The movement mirrors are moved by the movement of the substrate stage 114 in the direction of X and Y. A substrate is placed through a table (not shown) capable of being controlled in the Z direction and for rotation about X, Y, and Z axes.

It is important for the X-Y stage apparatus that the substrate stage 114 is controlled for its position in a short position-adjusting time, and it is controlled for its velocity in a short velocity-adjusting time. Accordingly, it is desirable that the entire apparatus has a high mechanical resonance frequency. Therefore, it is desirable that the static pressure air bearing has high rigidity in the vertical direction, and the pedestal has a light weight and also has a property that it is not readily flexed due to movement of the substrate stage 114 (more specifically, movement of the X movable unit and the Y movable unit).

However, in the conventional X-Y stage apparatus as described above, those made of iron having relatively heavy weights and small rigidity have been used for the pedestal 100 and the X guide 102. For this reason, the entire apparatus has a low mechanical resonance frequency, and deflection occasionally occurs in the pedestal 100 due to movement of the substrate stage 114. In addition, the pedestal 100 is apt to be scratched. When it is scratched, the scratched portion is rusted, or a bulge called "burr" is generated thereon. Accordingly, there has been an inconvenience that the moving performance of the stage is deteriorated when the amount of bulge exceeds the bearing gap of 5 to 10 $\mu$m.

The reason why the pedestal made of iron has been hitherto used is that each of movable members is supported over the pedestal through magnetically pre-loaded air bearings. In the case of the static pressure air bearing, it is important to set the bearing gap to have an optimum value because the rigidity of the bearing gap affects pitching and rolling performance of the movable unit. Thus, it has been hitherto necessary that the pedestal and so on should be made of a magnetic material because the bearing gap of the magnetically pre-loaded air bearing is determined by the balance between the pneumatic pressure provided through air-ejecting ports and the attractive force of magnets attached to the movable unit for attracting the pedestal and so on.

Characteristics of the magnetically pre-loaded air bearing can be controlled by adjustment of magnetic force by replacing magnets, or by change in attachment positions of magnets. Such an adjustment operation can be performed for single parts, however, it cannot be performed after assembling the stage apparatus and the exposure apparatus. Due to this reason, there has been an inconvenience that it is difficult to finely adjust dispersions of bearing gaps resulting from errors in processing of parts or assembling errors.

In addition, when the magnetically pre-loaded air bearing is used, an eddy current is generated by the electromagnetic induction effect in the vicinity of the surface of iron in accordance with relative movement of the magnet and iron. The eddy current and the magnetic force act to generate a force in a direction to stop movement of the movable unit. Accordingly, it is necessary for a driving linear motor to generate a large thrust force, resulting in an inconvenience that the motor necessarily has a large size, the electric power consumption increases, and the amount of heat generation increases as well.

In the conventional X-Y stage apparatus as described above, a single linear motor is used to drive the substrate stage in the Y direction. Accordingly, the apparatus suffers large external disturbance due to thrust ripple when it is controlled at a constant velocity. In addition, the linear motor for driving in the Y direction is located under an optical path for the Y interferometer (not shown) and along the optical path. For this reason, there has been also an inconvenience that an error is caused in the value measured by the interferometer due to temperature-dependent fluctuation in air existing on the optical path resulting from the influence of the increased heat generation even when forced cooling is applied.

SUMMARY OF THE INVENTION

The present invention has been made considering the inconveniences possessed by the conventional art. A first object of the present invention is to provide a stage apparatus in which the electric power consumption of a driving means for a movable unit can be reduced, the amount of heat generation can be reduced, and the bearing gap can be adjusted highly accurately after assembling.

A second object of the present invention is to provide a stage apparatus in which the influence of thrust ripple of a linear motor is small, and the diffusion of heat to an optical path of a laser interferometer can be restrained when it is used for an exposure apparatus or the like.

Thus according to the present invention, there is provided a stage apparatus comprising a pedestal 12, at least one guide bar 14 which is fixed on the pedestal 12, a first movable unit which is movable in a predetermined first direction along an upper surface of the pedestal 12 and the guide bar 14, and a second movable unit which is guided by the first movable unit and movable along the pedestal 12 in a second direction perpendicular to the first direction, wherein vacuum-pre-loadable static pressure air bearings, which comprise vacuum ports having independently controllable pressures and gas-ejecting ports, are provided on a surface of the first movable unit opposing to the pedestal 12 and on another surface of the first movable unit opposing to the guide bar 14. In the present invention, the vacuum-pre-loadable static pressure air bearings, in which pressures of their vacuum ports can be independently controlled, are provided on the surface of the first movable unit opposing to the pedestal and on the another surface of the first movable unit opposing to the guide bar respectively. Thus it is possible to set each of bearing gaps to be in an optimum state by controlling the pressure (attractive force) of the vacuum port of the respective static pressure air bearing after assembling. Moreover, the force acting in the direction to stop the movable unit resulting from the eddy current disappears, which would otherwise arise a problem if a pedestal and a guide bar both made of iron are used as in the conventional air. Accordingly, the driving force for the movable unit can be decreased.

The term "air bearing" used herein means not only a bearing actuated by air but also bearing actuated by other gas such as nitrogen, inert gas.

DESCRIPTION OF THE PREFERRED EMBODIMENT

An embodiment of the present invention will be explained below with reference to FIGS. 1 to 3.

Figure 1:
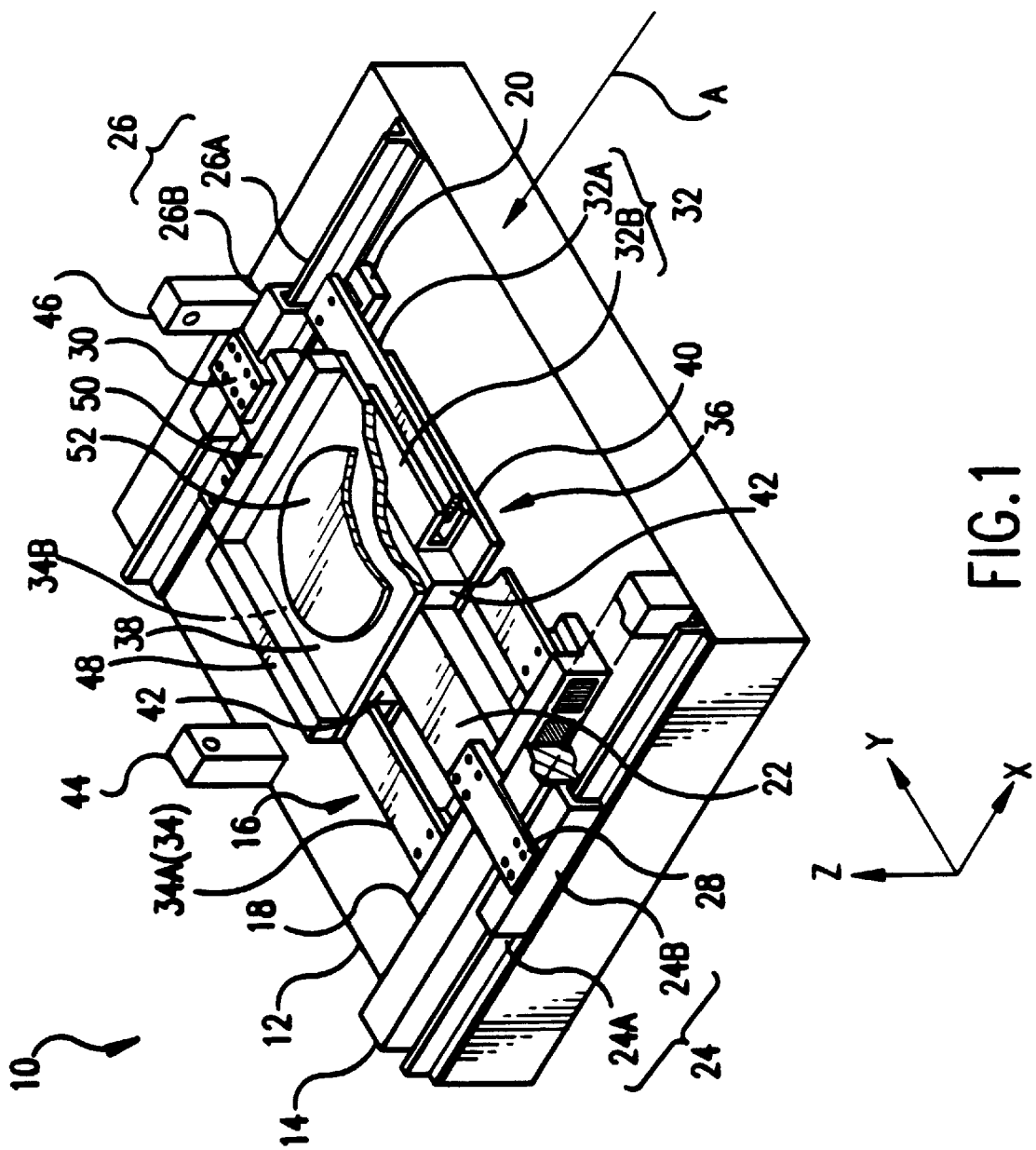
FIG. 1 shows a perspective view illustrating a schematic arrangement of a stage apparatus according to an embodiment of the present invention.

FIG. 1 schematically shows an X-Y stage apparatus 10 as an embodiment of the stage apparatus according to the present invention. The X-Y stage apparatus 10 comprises a pedestal 12, an X guide 14 as a guide bar which is fixed on the pedestal 12, a first movable unit 16 which is movable in the X direction (predetermined first direction) in FIG. 1 along an upper surface of the pedestal 12 and the X guide 14, and a second movable unit 36 which is movable in the Y direction (second direction) perpendicular to the X direction along a Y guide 22 which constitutes the first movable unit 16 and serves as a guide for movement.

A material having an oblong shape made of alumina ceramic, which has a light weight and is scarcely scratched as compared with iron, is used for the pedestal 12. An upper surface of the pedestal 12 serves as a reference plane.

A material also made of alumina ceramic is used for the X guide 14. The X guide 14 is arranged along the X direction on the pedestal 12 in the vicinity of one end surface in the Y direction. A surface of the X guide 14 opposing to the other end surface of the pedestal 12 in the Y direction serves as a reference plane.

The first movable unit 16 includes a first Y guide carrier 18, a second Y guide carrier 20, and the Y guide 22 described above. The first Y guide carrier 18 is arranged along the pedestal 12 in the close vicinity of the X guide 14 along the X direction, and composed of a member having an L-shaped cross-section to serve as a first carrier for guiding movement. The second Y guide carrier 20 is spaced apart from the first Y guide carrier 18 by a predetermined distance, arranged along the pedestal 12 in parallel to the first Y guide carrier 18, and composed of a slender plate-shaped member to serve as a second carrier for guiding movement. The Y guide 22 extends in the Y direction to make a bridge between the first and second Y guide carriers 18, 20.

A stator 24A of a first X linear motor 24 is provided on one side of the X guide 14 in the Y direction on the pedestal 14, which is arranged in the close vicinity of the X guide 14 and extends in the X direction. A stator 26A of a second X linear motor 26 is provided in the vicinity of the other end in the Y direction on the pedestal 14, which is arranged on the other side of the second Y guide carrier 20 in the Y direction, and extends in the X direction. In this embodiment, linear motors of the so-called moving magnet type are used for the first and second linear motors 24, 26 as clarified from FIG. 1.

A movable element 24B of the first X linear motor 24 is coupled to one end of the Y guide 22 through a coupling member 28. A movable element 26B of the second X linear motor 26 is coupled to the other end of the Y guide 22 through a coupling member 30. Thus the first movable unit 16 is driven in the X direction in accordance with the movement of the movable elements 24B, 26B of the first and second X linear motors 24, 26.

Stators 32A, 34A of first and second Y linear motors 32, 34 are arranged along the Y direction on one side and the other side of the Y guide 22 in the X direction, with which the first and second Y guide carriers 18, 20 are bridged. However, in FIG. 1, a movable element of the second Y linear motor located on the back is omitted from illustration. Linear motors of the moving magnet type are also used for the first and second Y linear motors.

The second movable unit 36 includes a top plate 38, a bottom plate 40, and a pair of Y direction bearings 42, 42. The top plate 38 and the bottom plate 40 are provided in parallel to one another so that the Y guide 22 is vertically interposed therebetween, and they are arranged approximately in parallel to the upper surface of the pedestal 12 (reference plane). The pair of Y direction bearings 42, 42 couple the top plate 38 and the bottom plate 40 to one another on both sides of the Y guide 22. The Y direction bearings 42, 42 are disposed in parallel to the Y guide 22 in a state in which predetermined gaps are formed between the Y guide 22 and them. Movable elements 32B, 34B (34B is not shown) of the first and second Y linear motors 32, 34, which constitute driving means for the second movable unit 36, are attached to outer surfaces of the Y direction bearings 42, 42. The second movable unit 36 is driven in the Y direction in accordance with the movement of the movable elements 32B, 34B of the Y linear motors 32, 34. Air-ejecting ports (not shown) are provided on inner surfaces of the Y direction bearings 42, 42 (on sides of the Y guide 22). The Y direction bearings 42, 42 is set to have a size in the direction of height which is larger than a size of the Y guide 22 in the direction of height.

The top plate 38 also serves as a substrate stage. An X movement mirror 48, a Y movement mirror 50, and a substrate 52 are carried on an upper surface of the top plate 38. The X movement mirror 48 and the Y movement mirror 50 reflect laser beams radiated from a laser interferometer 44 for X coordinate measurement and a laser interferometer 46 for Y coordinate measurement fixed on the pedestal 12 respectively. In the practical use, the substrate 52 is placed over the top plate 38 through a Z leveling stage (not shown) which is capable of vertical movement (in the Z direction) and rotation about the X, Y, and Z axes.

Figure 2A:
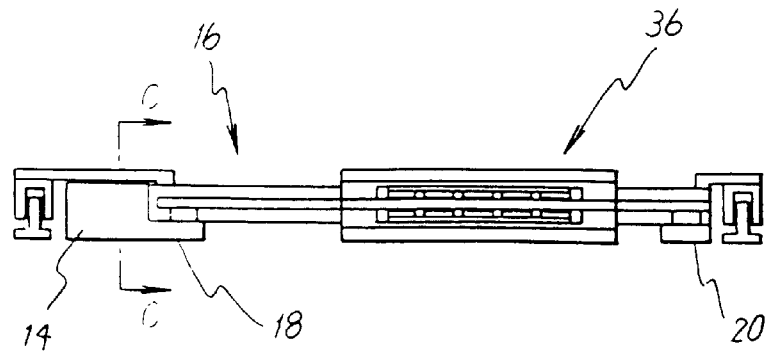
FIG. 2A is a view illustrating important portions essentially comprising a first movable unit and a second movable unit as viewed in a direction of an arrow A in FIG. 1.

In this embodiment, the apparatus includes, at various positions, vacuum-pre-loadable static pressure air bearings (hereinafter referred to as "static pressure air bearing", if necessary) comprising air-ejecting ports (hereinafter referred to as "ejecting port") and vacuum-pre-loadable ports (hereinafter referred to as "vacuum port"). Explanation will be made for this point below with reference to FIG. 2. FIG. 2A is a view illustrating important portions essentially comprising the first movable unit 16 and the second movable unit 36 as viewed in a direction of an arrow A in FIG. 1, FIG. 2B is a bottom view for FIG. 2A, and FIG. 2C is a cross-sectional view taken along a line C—C in FIG. 2A.

Figure 2B:
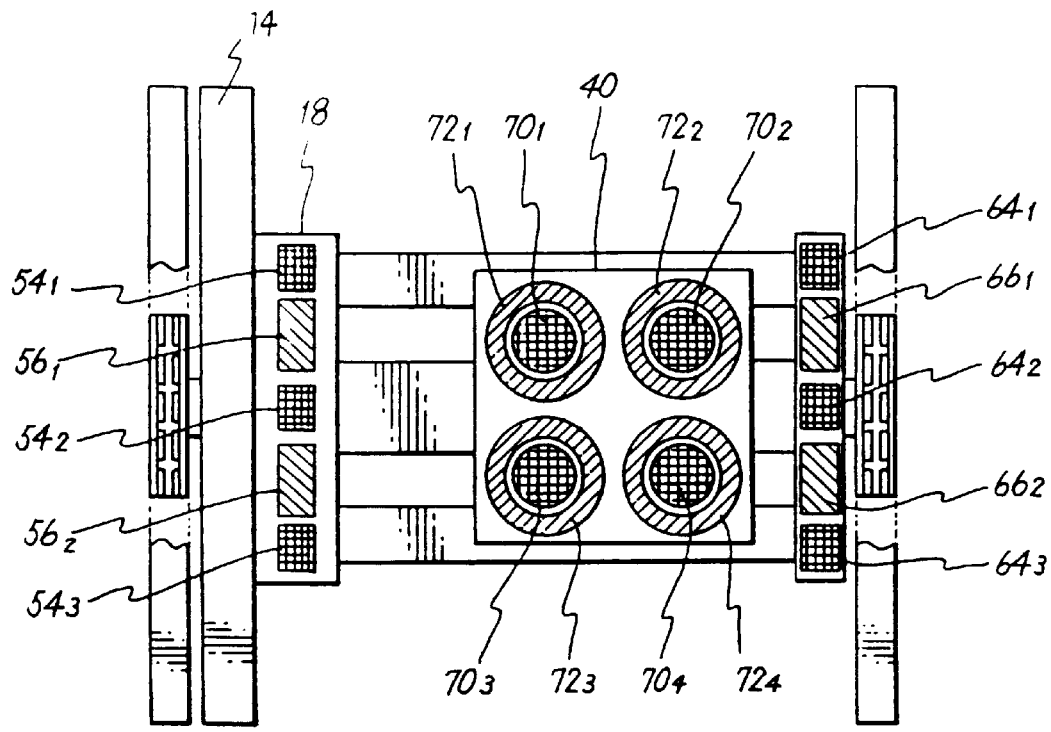
FIG. 2B is a bottom view for FIG. 2A.
Figure 2C:
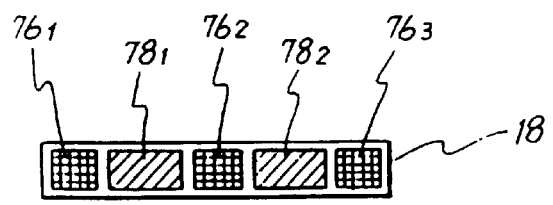
FIG. 2C is a cross-sectional view taken along a line C—C in FIG. 2A.

As shown in FIG. 2B, ejecting ports 54 ($54_1$ to $54_3$) and vacuum ports 56 ($56_1$ to $56_2$) are alternately provided on a surface of the first Y guide carrier 18 opposing to the pedestal 12. As shown in FIG. 3 which shows driving lines for the ejecting ports and the vacuum ports, compressed air from a compressor 60 is supplied to each of the ejecting ports 54, and each of the vacuum ports 56 is connected to a vacuum pump 62 as a vacuum source through a vacuum pressure control valve 58 with which only the pressure of the vacuum ports 56 can be manually adjusted. By using them, it is possible to control the bearing gap (gap generated between the upper surface of the pedestal 12 and the Y guide carrier 18) which is produced in accordance with the balance between the pneumatic pressure and the vacuum attractive force.

As shown in FIG. 2B, ejecting ports 64 ($64_1$ to $64_3$) and vacuum ports 66 ($66_1$ to $66_2$) are alternately provided on a surface of the second Y guide carrier 20 opposing to the pedestal 12 in the same manner as described above. As shown in FIG. 3, compressed air from the compressor 60 is supplied to each of the ejecting ports 64, and each of the vacuum ports 66 is connected to the vacuum pump 62 through a vacuum pressure control valve 68 with which only the pressure of the vacuum ports 66 can be manually adjusted. By using them, it is possible to control the bearing gap (gap generated between the upper surface of the pedestal 12 and the Y guide carrier 20) which is produced in accordance with the balance between the pneumatic pressure and the vacuum attractive force.

As shown in FIG. 2B, ejecting ports 70 ($70_1$ to $70_4$) and vacuum ports 72 ($72_1$ to $72_4$) are provided on a surface of the bottom plate 40 of the second movable unit 36 opposing to the pedestal 12 in the same manner as described above. As shown in FIG. 3, compressed air from the compressor 60 is supplied to each of the ejecting ports 70, and each of the vacuum ports 72 is connected to the vacuum pump 62 through a vacuum pressure control valve 74 with which only the pressure of the vacuum ports 72 can be manually adjusted. By using them, it is possible to control the bearing gap (gap between the pedestal 12 and the bottom plate 40) which is produced in accordance with the balance between the pneumatic pressure and the vacuum attractive force. In this arrangement, predetermined clearances can be set and maintained between the Y guide 22 and the top plate 38 and between the Y guide 22 and the bottom plate 40 by adjusting the gap.

As shown in FIG. 2C, ejecting ports 76 ($76_1$ to $76_3$) and vacuum ports 78 ($78_1$ to $78_2$) are alternately provided on a surface of the first Y guide carrier 18 opposing to the X guide 14 in the same manner as described above.

Figure 3:
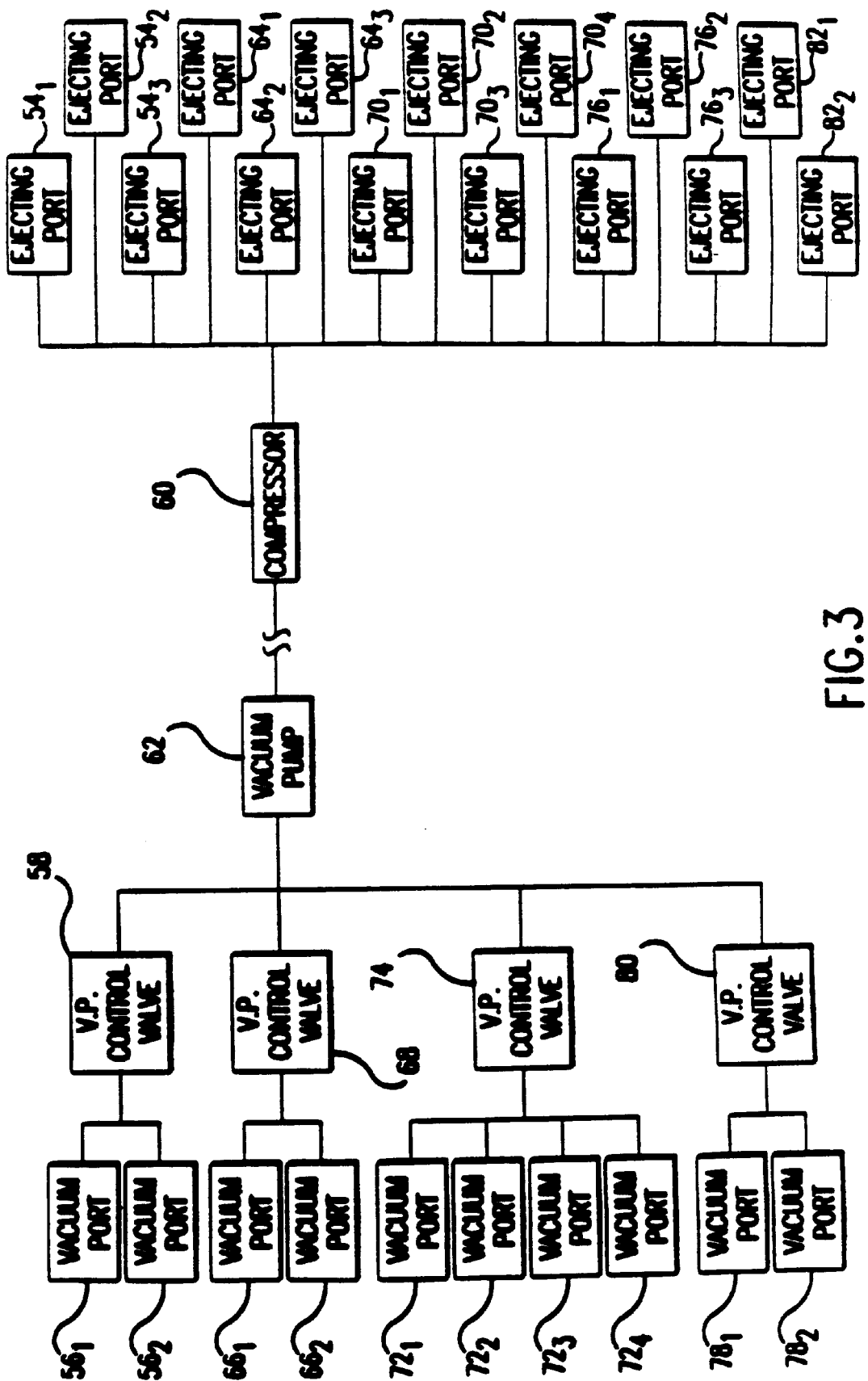
FIG. 3 shows driving lines for vacuum-pre-loadable ports and air-ejecting ports which constitute each of vacuum-pre-loadable static pressure air bearings.

As shown in FIG. 3, compressed air from the compressor 60 is supplied to the ejecting ports 76, and the vacuum ports 78 are connected to the vacuum pump 62 through a vacuum pressure control valve 80 with which only the pressure of the vacuum ports 78 can be manually adjusted. Thus it is possible to control the bearing gap (gap between the first Y guide carrier 18 and the X guide 14) which is produced in accordance with the balance between the pneumatic pressure and the vacuum attractive force.

Ejecting ports $82_1$, $82_2$ are provided on surfaces of the Y direction bearings 42, 42 opposing to the Y guide 22 (see FIG. 3). Predetermined bearing gaps are maintained in accordance with the balance between pneumatic pressures of the both.

Next, the operation of the X-Y stage apparatus 10 constructed as described above will be described.

When the pressures of the vacuum ports, 56, 66, 72, 78, which constitute each of the vacuum-pre-loadable static pressure air bearings, are individually adjusted by using the vacuum pressure control valves 58, 68, 74, 80, the bearing gap of each of the air bearings is adequately set. In this embodiment, the vacuum pressure control valves 58, 68, 74, 80 are manually operated. However, it is also possible to use those which can automatically adjust the pressures of the vacuum ports in accordance with computer control on the basis of predetermined conditions.

When the first and second X linear motors 24, 26 and the first and second Y linear motors 32, 34 are driven in a state in which the bearing gap of each of the air bearings is adequately set, the second movable unit 36 on which the substrate 52 is carried moves in the X-Y two dimensional directions in response to the driving of the motors, and its position of movement is measured by the laser interferometers 44, 46.

According to this embodiment as described above, since the pedestal 12 and the X guide 14 are made of alumina ceramic, the weight is about a half (specific gravity of iron: 7.8, specific gravity of alumina: 3.8), and the rigidity is 1.85-fold (Young's modulus of iron: 210 GPa, Young's modulus of alumina: 390 GPa) as compared with the pedestal and so on made of iron having been used in the conventional stage apparatus. Since the alumina ceramic is scarcely scratched, and it causes no burr even if it is scratched, the moving performance of the first and second movable units 16, 36 is not deteriorated. Since the supporting method of the vacuum-pre-loadable static pressure air bearing, in which the pressures of the vacuum ports are individually and independently adjustable, is adopted for supporting the first movable unit 16 in the vertical direction and in the Y direction and for supporting the second movable unit 36 in the vertical direction, the bearing gap can be adjusted at a high accuracy, for example, at an accuracy of 0.1 μm in order to provide a state in which the static pressure air bearings exhibit the maximum performance after assembling. Therefore, the entire apparatus has a high mechanical resonance frequency, and it is possible to shorten the position-adjusting time and the velocity-adjusting time upon positioning of the substrate stage (second movable unit 36).

Moreover, since the vacuum-pre-loadable static pressure air bearings are used as the static pressure air bearings, the force (resistant force) resulting from the eddy current acting in the direction to stop the movable unit disappears, which would otherwise arise if magnetically pre-loaded air bearings are used. Thus the linear motors can be made small, resulting in small electric power consumption and small heat generation.

The attractive force always acts between the movable unit and the pedestal and between the movable unit and the guide in the case of the use of permanent magnets, whereas the attractive force can be made zero by stopping the vacuum source in the case of the use of the vacuum-pre-loadable static pressure air bearings as described above. Thus the first and second movable units 16, 36 can be easily removed from the main apparatus today, resulting in improvement in maintenance.

The stators 32A, 34A of the Y linear motors 32, 34 are installed in parallel to the Y guide 22 to provide the arrangement that he first and second Y linear motors 32, 34 interpose the Y guide 22 installed just under the optical path of the laser beam radiated from the interferometer 46. Thus the disturbance due to thrust ripple upon the control at a constant velocity can be mitigated owing to the averaging effect. At the same time, the diffusion of heat to the optical path of the laser interferometer decreases during exposure. Accordingly, the accuracy for coordinate measurement is improved.

The X linear motors 24, 26, as a matter of course, as well as the Y linear motors 32, 34 can be replaced without disassembling the second movable unit 36. Accordingly, there is provided improvement in maintenance.

The embodiment described above has been exemplified by the use of the linear motors of the moving magnet type, however, the present invention is not limited thereto. It is a matter of course that linear motors of the moving coil type may be used instead thereof.

Figure 4:
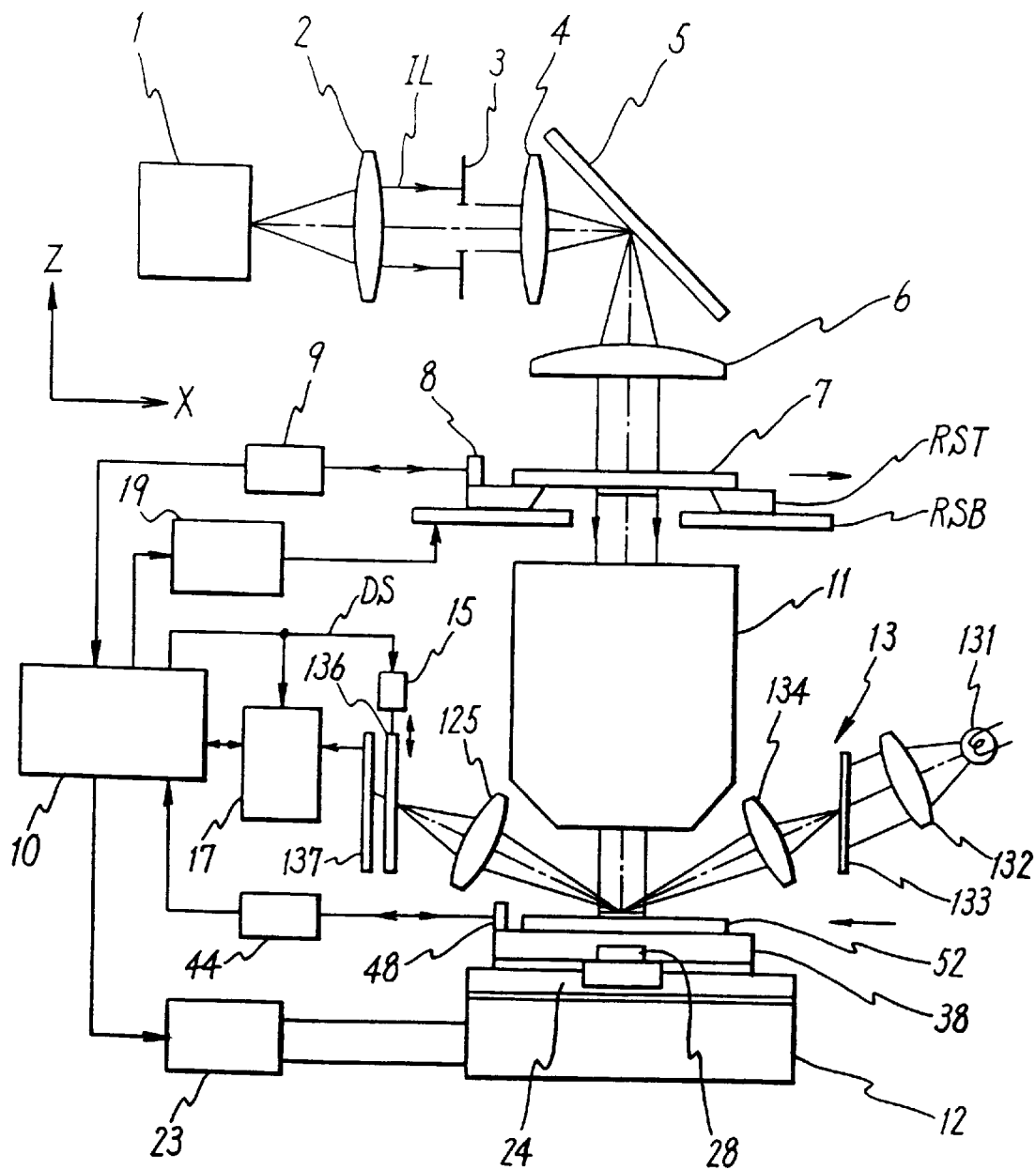
FIG. 4 shows an arrangement of a projection exposure apparatus of the step-and-scan system to which the stage apparatus of the present invention is applied.
Figure 5:
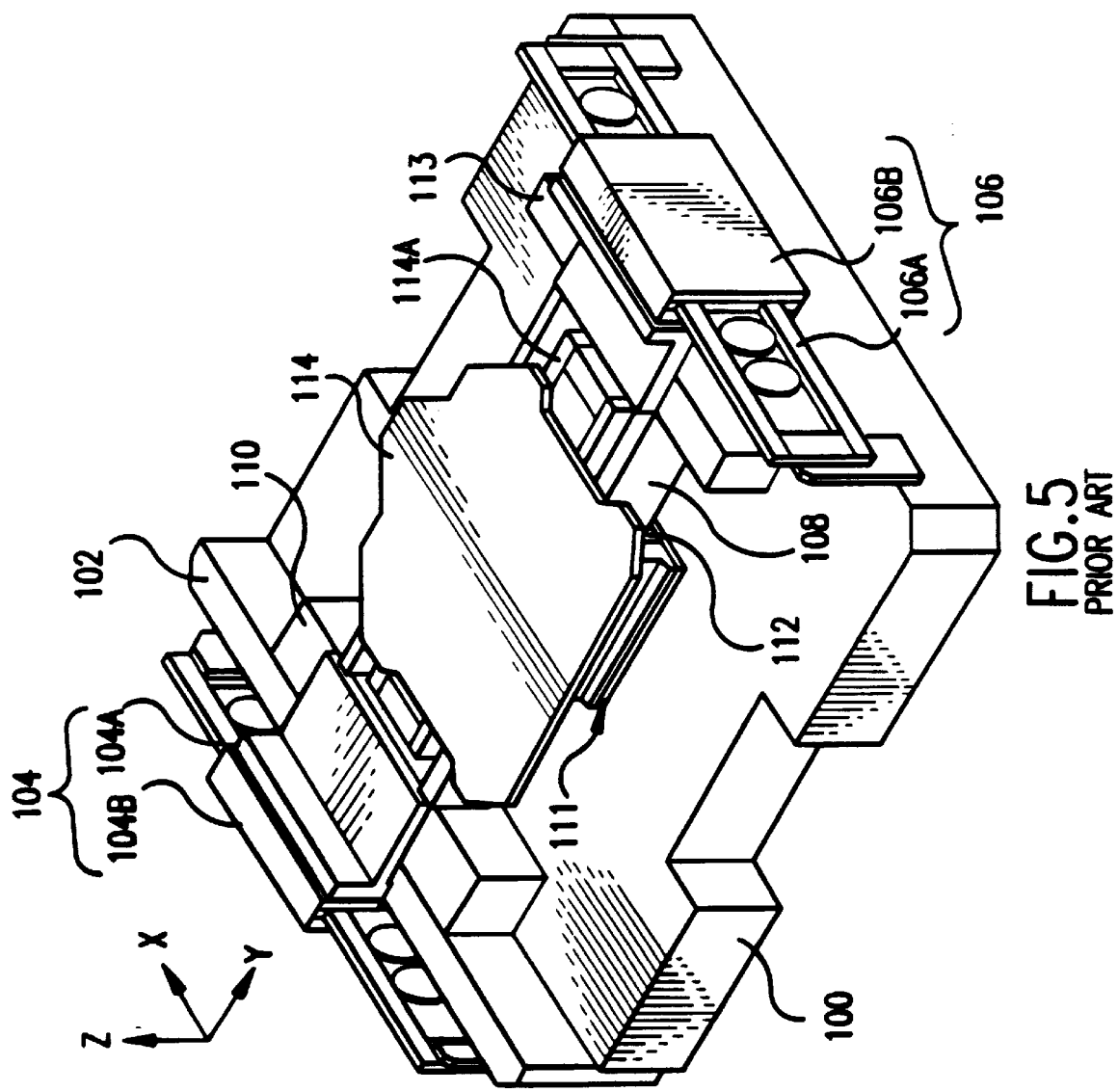
FIG. 5 shows a schematic perspective view illustrating the conventional stage apparatus.

FIG. 4 shows an arrangement in which the stage apparatus of this embodiment is applied to a projection exposure apparatus of the step-and-scan system. In FIG. 4, illumination light IL for exposure, which is radiated from a light source system 1 including a light source, an optical integrator and so on, passes through a first relay lens 2, a reticle blind (variable field diaphragm) 3, a second relay lens 4, a mirror 5, and a main condenser lens 6. Thus a reticle 7 is illuminated with the illumination light IL with uniform illuminance distribution. A plane on which the reticle blind 3 is arranged is substantially conjugate with a plane of the reticle 7 on which a reticle pattern is formed.

An image of the pattern on the reticle 7 is projected through a projection optical system 11 onto the substrate 52 on which a photoresist is applied, and the substrate 52 is exposed therewith. Now a Z axis is defined in parallel to an optical axis of the projection optical system 11. An X axis is defined in parallel to the plane of paper in FIG. 1, and a Y axis is defined perpendicularly to the plane of paper in FIG. 1 within a two-dimensional plane perpendicular to the optical axis. The reticle 7 is held on a reticle stage RST. The reticle stage RST is driven, for example, by a linear motor in the X direction which is the scanning direction. An X coordinate of the reticle 7 is measured by an X movement mirror 8 provided on the reticle stage RST and a laser interferometer 9 provided externally. The X coordinate is supplied to a main control system 10 for managing and controlling the operation of the entire apparatus. The main control system 10 controls a reticle stage driving system 19 to move the reticle 7 into a certain position and in a certain moving velocity.

The stage apparatus 12 in the above mentioned embodiment is arranged under the projection optical system 11. A semiconductor wafer as the substrate 52 is placed over the stage top plate 38 through a Z leveling stage. The height of the stage top plate 38 of the stage apparatus is adjusted so that the surface of the semiconductor wafer is conjugate with the surface of reticle pattern of the reticle 7 in relation to the projection optical system 11.

An X coordinate of the substrate 52 is always monitored by the movement mirror 48 for the X axis fixed on the upper end of the top plate 38 and the laser interferometer 44 provided externally. The detected X coordinate is supplied to the main control system 10.

The main control system 10 controls the operation of the X linear motors 24, 26 and the Y linear motors 32, 34 of the stage apparatus 12 through a driving system 23 on the basis of the supplied coordinate. For example, when exposure is performed in accordance with the scanning exposure system, it may be assumed that the projection optical system 11 projects an inverted image with a projection magnification β (for example, β is ¼, etc.). On this condition, the first movable unit 16 is scanned in the −X direction (or in the +X direction) at a velocity VW (=·β·VR) in synchronization with the reticle 7 which is scanned at a velocity VR through the reticle stage in the +X direction (or in the −X direction). In this embodiment, the first movable unit 16 moves in the +X direction (or in the −X direction). The first movable unit 16 moves while being supported by the vacuum-pre-loadable static pressure air bearings provided with the ejecting ports and the vacuum ports.

The projection exposure apparatus includes a focal position detecting system 13 (AF sensor) for detecting the position on the surface of the substrate 52 in the Z direction (focal position). A detecting light beam, which is insensitive to the photoresist applied to the substrate 52, is radiated from a light source 131 for the AF sensor 13. Slits in a light-transmitting slit plate 133 are illuminated with the detecting light beam through a condenser lens 132. Images of the slits are projected onto the substrate 52 obliquely with respect to the optical axis of the projection optical system 11 through an objective lens 134. Light beams reflected by corresponding measuring points are collected on a vibration slit plate 136 through a collector lens 125. The slit images projected onto the measuring points are reconstructed on the vibration slit plate 136. The vibration slit plate 136 is vibrated in predetermined directions by a vibrator 15 which is driven by a driving signal DS from the main control system 10. The light beams passed through a slit of the vibration slit plate 136 are photoelectrically converted by a photoelectric converter element on a photoelectric detector 137 respectively. These photoelectrically converted signals are supplied to a signal processing system 17, and they are supplied to the main control unit 10 after signal processing.

According to the present invention as described above, the mechanical resonance frequency of the entire apparatus can be raised. Accordingly, it is possible to shorten the position-adjusting time upon the positional control and the velocity-adjusting time upon the velocity control for the movable units. Even if the pedestal is scratched, no burr occurs. Thus there is provided an excellent effect that the moving performance of the movable units is not deteriorated, which has not been achieved in the conventional art.

According to the present invention, it is possible to set each of the bearing gaps to be in the optimum state by controlling the pressure (attractive force) of the vacuum ports of each of the static pressure air bearings after assembling. Thus there is provided an effect that the bearing gaps can be adjusted after assembling so that each of the static pressure air bearings exhibits the maximum performance.

According to the present invention, it is possible to set each of the bearing gaps to be in the optimum state by controlling the pressure (attractive force) of the vacuum ports of each of the static pressure air bearings after assembling. Moreover, the force resulting from the eddy current acting in the direction to stop the movable unit disappears. Thus the driving force for the movable unit can be made small to that extent. Accordingly, the linear motors and so on for constituting the driving means for the movable units can be made small, the electric power consumption can be reduced, and the amount of heat generation can be reduced.

According to the present invention, the disturbance due to thrust ripple upon the control at a constant velocity is mitigated owing to the averaging effect. In addition, when the movement position of the second movable unit is detected by using the laser interferometer, the diffusion of heat to the optical path of the laser interferometer decreases, and hence the accuracy for coordinate measurement can be improved.

Further, there is provided an effect that each of the bearing gaps can be set to be in the optimum state by controlling the pressure (attractive force) of the vacuum ports of each of the static pressure air bearings after assembling.

The present invention may be practiced or embodied in other various forms without departing from the spirit or essential characteristics thereof. For example, although in the above mentioned embodiments air was used for gas ejected from the ejecting ports, nitrogen gas or inert gas such as argon gas may be used instead of air. It will be understood that the scope of the present invention is indicated by the appended claims, and all variations and modifications which come within the equivalent range of the claims are embraced in the scope of the present invention.

What is claimed is:

1. A method for controlling a stage having at least one guide bar fixed on a pedestal and a first movable unit that is movable in a first direction along an upper surface of the pedestal and the first guide bar, the method comprising the steps of:

driving the first movable unit in the first direction along the upper surface of the pedestal and the at least one first guide bar; and supporting the first movable unit with a vacuum-pre-loadable static pressure air bearing by applying a vacuum to vacuum ports and by ejecting gas from gas-ejecting ports, the vacuum ports and the gas-ejecting ports formed on a first surface of the first movable unit opposing the pedestal and on another surface of the first movable unit opposing the at least one first guide bar, wherein during operation pressures of the vacuum ports are independently controlled.

2. The method of claim 1, wherein the driving step is performed by at least one motor.

3. The method of claim 2, wherein the at least one motor is a linear motor having a stator arranged parallel to the first guide bar.

4. The method of claim 1, wherein the stage apparatus also includes a second guide bar on the first movable unit and extending in a second direction perpendicular to the first direction and a second movable unit that is movable along the second guide bar in the second direction, the method further comprising the step of:

supporting the second movable unit with a vacuum-pre-loadable static pressure air bearing formed on a surface of the second movable unit opposing the pedestal.

5. The method of claim 4, further comprising driving the second movable unit in the second direction by at least one motor.

6. The method of claim 5, wherein the at least one motor is a linear motor having a stator which is arranged parallel to the second guide bar.

7. The method of claim 1, wherein the pressures of the vacuum ports formed on the first surface of the first movable unit are controlled independently of pressures of the vacuum ports formed on the another surface of the first movable unit.

8. The method of claim 7, wherein the vacuum ports and gas-ejecting ports forming the vacuum-pre-loadable static pressure air bearing between the pedestal and the first movable unit are first vacuum ports and first gas-ejecting ports, the stage apparatus also includes a second guide bar on the first movable unit and extending in a second direction perpendicular to the first direction and a second movable unit that is movable along the second guide bar in the second direction, the method further comprising the steps of:

supporting the second movable unit with a second vacuum-pre-loadable static pressure air bearing between the second movable unit and the pedestal that includes second vacuum ports, second gas-ejecting ports and third gas-ejecting ports formed so that the second guide bar is interposed therebetween; and controlling a pressure of the second vacuum ports independently of a pressure of the first vacuum ports.

9. The method of claim 1, wherein the stage apparatus is part of a projection exposure apparatus that projects a light image on a photosensitive substrate.

10. The method of claim 1, wherein at least one of the vacuum ports is disposed such that the vacuum port surrounds at least one of the gas ejecting ports.

11. A method for operating a stage which is movably supported on a pedestal, comprising the steps of:

arranging the stage so as to oppose the pedestal, part of the pedestal made of non-magnetic material;

generating an attractive force and a repulsive force with at least one vacuum port and at least one gas ejecting port arranged alternately;

adjusting a gap between the stage and the pedestal; and driving the stage.

12. The method for operating a stage according to claim 11, wherein the non-magnetic material is ceramic.

13. The method for operating a stage according to claim 11, wherein the stage is a part of an exposure apparatus for exposing a substrate with a pattern.

14. The method for operating a stage according to claim 11, wherein the vacuum port includes a plurality of vacuum ports.

15. The method for operating a stage according to claim 14, wherein there are a plurality of the gas ejecting ports.

16. The method for operating a stage according to claim 11, wherein the at least one vacuum port and the at least one gas ejecting port are arranged linearly.

17. The method according to claim 11, wherein the gap is adjusted with at least one of the attractive force and the repulsive force, and the stage is driven while maintaining a predetermined gap.

18. The method according to claim 11, wherein the at least one vacuum port and the at least one gas ejecting port are arranged in a direction substantially parallel to a driving direction of the stage.

19. A method for making a stage, comprising:

providing a movable member;

providing a pedestal which supports the movable member such that the movable member can move;

providing a bearing member between the movable member and the pedestal; and providing a drive device connected to the movable member and that drives the movable member;

wherein the pedestal has a surface part made of non-magnetic material and opposed to the bearing member, and the bearing member comprises at least one gas ejection section having a gas ejection port and at least one vacuum section having a vacuum port disposed so as to surround the gas ejection port.

20. The method according to claim 19, wherein the surface part of the pedestal is made of ceramic.

21. The method according to claim 20, wherein the surface part of the pedestal is made of alumina ceramic.

22. The method according to claim 19, further comprising providing a position detection device that detects the position of the movable member by irradiating a light beam to the movable member.

23. The method according to claim 22, wherein the drive device is provided such that the drive device does not interrupt the light beam.

24. The method according to claim 19, wherein at least part of the drive device is disposed under an optical path of the light beam.

25. The method according to claim 19, further comprising providing at least one guide bar, wherein the movable member moves along the pedestal and the guide bar.

26. The method according to claim 19, wherein the bearing member comprises a plurality of vacuum ports and pressures of the vacuum ports are independently controllable.

27. The method according to claim 19, wherein the position detector comprises at least one interferometer.

28. The method according to claim 27, wherein the movable member has a reflective portion and the interferometer irradiates the light beam to the reflective portion.

29. The method according to claim 19, wherein the drive device comprises at least one linear motor.

30. The method according to claim 29, wherein the linear motor is a moving magnet motor.

31. A method for making an exposure apparatus which forms an image on an object, comprising:

providing an exposure device which forms the image on the object;

providing a movable member disposed below the exposure device;

providing a pedestal which supports the movable member such that the movable member can move;

providing a bearing member between the movable member and the pedestal;

providing a drive device connected to the movable member and that drives the movable member; and providing a position detector that detects a position of the movable member by irradiating a light beam to the movable member, wherein the pedestal has a surface part made of non-magnetic material and opposed to the bearing member, and the drive device is provided such that the drive device does not interrupt the light beam.

32. The method according to claim 31, wherein the bearing member comprises at least one vacuum section having a vacuum port and at least one gas ejection system having a gas ejecting port, and adjusts a gap between the movable member and the pedestal.

33. The method according to claim 32, wherein the vacuum section and the gas ejection section are alternately arranged.

34. The method according to claim 32, wherein the vacuum port is disposed such that the vacuum port surrounds the gas ejecting port.

35. The method according to claim 31, wherein the surface part of the pedestal is made of ceramic.

36. The method according to claim 31, wherein the drive device includes at least one linear motor.

37. The method according to claim 31, wherein the linear motor is a moving magnet motor.

38. The method according to claim 31, wherein the exposure apparatus forms the image on the object while the movable member is moving.

39. A method for forming an image on an object utilizing the exposure apparatus manufactured by the method of claim 31.

40. The method according to claim 31, further comprising providing at least one guide bar, wherein the movable member moves along the pedestal and the guide bar.

41. The method according to claim 31, wherein the bearing member comprises a plurality of vacuum ports, and the pressures of the vacuum ports are independently controllable.

42. The method according to claim 31, wherein at least part of the drive device is disposed under the optical path of the light beam.

43. The method according to claim 31, wherein the position detector comprises at least one interferometer.

44. The method according to claim 43, wherein the movable member has a reflective portion and the interferometer irradiates the light beam to the reflective portion.

45. A method for controlling a stage having at least one movable member which moves along a surface of a pedestal, the method comprising the steps of:

supporting the movable member with a bearing member provided between the movable member and the pedestal;

driving the movable member with a drive device connected to the movable member; and detecting a position of the movable member with a position detector that irradiates a light beam to the movable member;

wherein the pedestal has a surface part made of non-magnetic material and opposed to the bearing member, the drive device is provided such that the drive device does not interrupt the light beam, and the bearing member comprises at least one vacuum section having a vacuum port and at least one gas ejection section having a gas ejecting port, and adjusts a gap between the movable member and the pedestal.

46. The method according to claim 45, wherein the vacuum section and the gas ejection section are alternately arranged.

47. The method according to claim 45, wherein the vacuum port is disposed such that the vacuum port surrounds the gas ejecting port.

48. The method according to claim 45, wherein the surface part of the pedestal is made of ceramic.

49. The method according to claim 45, wherein the drive device comprises at least one linear motor.

50. The method according to claim 49, wherein the linear motor is a moving magnet motor.

51. The method according to claim 45, wherein at least part of the drive device is disposed under an optical path of the light beam.

52. The method according to claim 45, further comprising providing at least one guide bar, wherein the movable member moves along the pedestal and the guide bar.

53. The method according to claim 45, wherein the bearing member comprises a plurality of vacuum ports and pressures of the vacuum ports are independently controllable.

54. The method according to claim 45, wherein the position detector comprises at least one interferometer.

55. The method according to claim 54, wherein the movable member has a reflective portion and the interferometer irradiates the light beam to the reflective portion.

56. A method for operating an exposure apparatus which forms an image on an object with an exposure device, the exposure apparatus comprising a stage having at least one movable member which holds the object and moves relative to the exposure device, the method comprising the steps of:

supporting the movable member opposed to a surface of a pedestal with a bearing member provided between the movable member and the pedestal;

driving the movable member with a drive device connected to the movable member; and detecting a position of the movable member with a position detector that irradiates a light beam to the movable member;

wherein the pedestal has a surface part made of non-magnetic material and opposed to the bearing member, the drive device is provided such that the drive device does not interrupt the light beam, and the bearing member comprises at least one vacuum section having a vacuum port and at least one gas ejection section having a gas ejecting port, and adjusts a gap between the movable member and the pedestal.

57. The method according to claim 56, wherein the vacuum section and the gas ejection section are alternately arranged.

58. The method according to claim 56, wherein the vacuum port is disposed such that the vacuum port surrounds the gas ejecting port.

59. The method according to claim 56, wherein the surface part of the pedestal is made of ceramic.

60. The method according to claim 56, wherein the drive device comprises at least one linear motor.

61. The method according to claim 60, wherein the linear motor is a moving magnet motor.

62. The method according to claim 56, wherein the exposure apparatus forms the image on the object while the movable member is moving.

63. The method according to claim 56, wherein at least part of the drive device is disposed under an optical path of the light beam.

64. The method according to claim 56, further comprising providing at least one guide bar, wherein the movable member moves along the pedestal and the guide bar.

65. The method according to claim 56, wherein the bearing member comprises a plurality of vacuum ports and the pressures of the vacuum ports are independently controllable.

66. The method according to claim 56, wherein the position detector comprises at least one interferometer.

67. The method according to claim 66, wherein the movable member has a reflective portion and the interferometer irradiates the light beam to the reflective portion.

68. A method for forming an image on an object utilizing the exposure apparatus manufactured by the method of claim 56.

69. A method for making a stage, comprising:

providing a movable member;

arranging a pedestal which movably supports the movable member so as to be opposed to the movable member;

connecting a bearing member with the movable member so as to position the bearing member between the movable member and the pedestal; and connecting a driving member which drives the movable member with the movable member;

wherein part of the pedestal opposed to the movable member is made of non-magnetic material, and the bearing member is provided with at least one vacuum port and at least one gas ejecting port arranged alternately.

70. The method according to claim 69, wherein the non-magnetic material is ceramic.

71. The method according to claim 69, wherein the at least one vacuum port includes a plurality of ports.

72. The method according to claim 69, wherein the stage is part of an exposure apparatus which forms a pattern on a substrate.

* * * * *